(12) United States Patent
Sumi et al.

(10) Patent No.: US 7,592,640 B2
(45) Date of Patent: Sep. 22, 2009

(54) LIGHT EMITTING SEMICONDUCTOR APPARATUS

(75) Inventors: Kazunori Sumi, Tokyo (JP); Dai Aoki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 341 days.

(21) Appl. No.: 11/739,877

(22) Filed: Apr. 25, 2007

(65) Prior Publication Data

US 2007/0262340 A1    Nov. 15, 2007

(30) Foreign Application Priority Data

Apr. 28, 2006    (JP) .............................. 2006-125765

(51) Int. Cl.
*H01L 21/00* (2006.01)
(52) U.S. Cl. ............................ 257/98; 257/99; 257/100; 438/27
(58) Field of Classification Search ................... 257/88, 257/91, 98–100; 438/26–29, 34, 35; 345/82
See application file for complete search history.

(56) References Cited

FOREIGN PATENT DOCUMENTS

JP    2005285874    10/2005

*Primary Examiner*—Zandra Smith
*Assistant Examiner*—Paul E Patton
(74) *Attorney, Agent, or Firm*—Cermak Kenealy Vaidya & Nakajima LLP

(57) ABSTRACT

The disclosed subject matter relates to a light emitting semiconductor apparatus with reduced color unevenness and suppressed topical deterioration over time with regard to an amount and chromaticity of the illuminating light. The light emitting semiconductor apparatus of the disclosed subject matter can include three separate bonding pads. Among those, the centrally located bonding pad is die bonded to two types of light emitting devices which have an identical material and structure and almost equal sizes, but are different in orientation and direction characteristic of PN-electrodes. The bonding pad located in an outermost location is die-bonded to the light emitting device. In this case, the direction characteristic of a central light emitting device exhibits a substantial reverse conical form while the direction characteristic of the light emitting device exhibits a substantial conical form. The light emitting device mounted on the central bonding pad and the light emitting device mounted on the outermost bonding pad can have respective electrodes on the wire bonding side which are stitch-bonded to bonding wires.

20 Claims, 6 Drawing Sheets

Light Emitting Semiconductor Device A

Light Emitting Semiconductor Device B

Light Emitting Semiconductor Device C

Light Emitting Semiconductor Device A

Light Emitting Semiconductor Device B

Light Emitting Semiconductor Device C

Light Distribution Overlap Region

LIGHT EMITTING SEMICONDUCTOR APPARATUS

This application claims the priority benefit under 35 U.S.C. § 119 of Japanese Patent Application No. 2006-125765 filed on Apr. 28, 2006, which is hereby incorporated in its entirety by reference.

BACKGROUND

1. Field

The disclosed subject matter relates to a light emitting semiconductor apparatus and more particularly to a light emitting semiconductor apparatus containing a plurality of light emitting semiconductor devices.

2. Description of the Related Art

A light emitting semiconductor device (hereinafter abbreviated as "light emitting device") has a small external size with a small emission amount of light, and accordingly has an optical property nearing that of a point light source. Typical light emitting semiconductor apparatus that include a light emitting device as a light emitting source are assembled, for example, in LCD back-lights, reading light sources for printers, panel illuminators, general illuminators, various indicators, etc. In such cases, a plurality of light emitting devices having almost equal light emission spectral distributions and direction characteristics are mounted to ensure a required (or desired) amount of illuminating light. The "direction characteristic" is defined as "a series of relative values of brightness measured at different angles to the optical axis of a light emitting semiconductor device and graphed with a continuous line".

In a further proposed light emitting semiconductor apparatus, a light emitting device is sealed in a light transmissive resin containing one or more wavelength conversion materials, such as phosphors. In this case, a light emitted from the light emitting device is used to excite the phosphor for wavelength conversion and release a light different in chromaticity from the light emitted from the light emitting device.

For example, if the light emitted from the light emitting device is a blue light, the apparatus may use a phosphor that can wavelength-convert the blue light into a complementary color of blue (e.g., a yellow light) when excited by the blue light. In this case, the yellow light that was wavelength-converted when part of the blue light emitted from the light emitting device excited the phosphor and the blue light that was emitted directly from the light emitting device are subjected to additional color mixture to obtain a light chromatically near a white light.

Similarly, if the light emitted from the light emitting device is a blue light, the apparatus may use two types of phosphors in mixture that can wavelength-convert the blue light into a green and a red light when excited by the blue light. In this case, the green and red lights (that result from the wavelength-conversion when part of the blue light emitted from the light emitting device excites the phosphors) and the blue light emitted directly from the light emitting device are subjected to additional color mixture to obtain a light chromatically almost equal to a white light.

In addition, if the light emitted from the light emitting device is an ultraviolet light, the apparatus may use three types of phosphors in mixture that can wavelength-convert the ultraviolet light into a blue, a green and a red light when excited by the ultraviolet light. In this case, the blue, green and red lights (that result from the wavelength-conversion when part of the ultraviolet light emitted from the light emitting device excites the phosphors) are subjected to additional color mixture to obtain a light chromatically almost equal to a white light.

Further, the types of light emitted from the light emitting device and the types of phosphor may be mixed appropriately to obtain various chromatic lights, such as a light almost equal to a white light or a light other than the light chromatically near the white light. For example, Japanese Patent Publication No. JP 2005-285874A and its English translation/equivalent which are hereby incorporated in their entireties by reference disclose such a light emitting device.

Even if the light emitting devices have the same semiconductor material and structure, that is, the same light emission spectral distribution, different external shapes and sizes of the light emitting devices can vary the direction characteristics of light emitted from the light emitting devices. Furthermore, if the external shapes and sizes are identical, different shapes and sizes of the electrodes can also vary the direction characteristics. In particular, an electrode located on a light exit surface of the light emitting device greatly affects the characteristics thereof.

For example, the following three types of different light emitting devices are assumed to have the same material and structure (the same light emission spectral distribution) and almost the same size with differences only in external form. A light emitting device A is in the form of an almost cube, as shown in FIG. 1. A light emitting device B is in the form of an almost truncated quadrangular pyramid, as shown in FIG. 2. A light emitting device C is in the form of an almost truncated reverse quadrangular pyramid, as shown in FIG. 3. They have respective direction characteristic, which are graphed in curved forms as shown in FIG. 4 for the light emitting device A, FIG. 5 for the light emitting device B, and FIG. 6 for the light emitting device C. These figures show curves that represent the intensity of light (luminous intensity: cd) in polar coordinates (distribution curves of luminous intensity), which indicate how intense and in which direction the light can be emitted from the light emitting devices A, B, C. A light distribution is fundamentally determined by measuring the intensity of light across the whole cross section although it is represented by luminous intensities in a single cross section because luminous intensities in different cross sections are almost identical. The external graph forms of the direction characteristics are expressed as follows. Namely, the light emitting device A has an almost spherical form as shown in FIG. 4, the light emitting device B has an almost reverse conical form as shown in FIG. 5, and the light emitting device C has an almost conical form as shown in FIG. 6.

A plurality of light emitting devices with almost equal light emission spectral distributions and direction characteristics can be mounted and sealed in a sealing resin composed of a light transmissive resin containing one or more phosphors to configure a light emitting semiconductor apparatus. A conventionally proposed example of such apparatus has an arrangement shown in FIGS. 14 and 15. FIG. 14 is a front view, and FIG. 15 is a cross-sectional view taken along line A-A of FIG. 14.

The apparatus shown in FIGS. 14 and 15 includes a resin molding body 51 (hereinafter referred to as "lamp house 51") formed as a package obtained by insert molding a lead frame 50 in resin and forming a recess 53 therein having an aperture 52. The recess 53 has an inner bottom, through which four bonding pads 54 are exposed in line on respective ends of four separate lead frames 50. Among those, the outermost bonding pads 54 in a pair extend through the lamp house 51 and lead out of the outer circumferential surface of the lamp house 51 to an area external to the device. A pair of external connection terminals 55 on the other end of the lead frames 50 are located along the outer circumferential surface of the lamp house 51.

Light emitting devices C of FIG. 3 (reference 56 in FIG. 15) are die-bonded via a conductive bonding member to the three bonding pads 54 that are exposed through the inner bottom of the recess 53, respectively. The light emitting device 56 has a lower electrode electrically conducted to the bonding pad 54 on which the light emitting device 56 is mounted.

On the other hand, an upper electrode on the light emitting device 56 and a bonding pad 54 adjacent to the bonding pad 54 on which the light emitting device 56 is mounted are wire-bonded to each other via a bonding wire 57 to establish electrical conduction therebetween.

Further, the recess 53 is filled with a sealing resin 58 composed of a light transmissive resin containing one or more phosphors to seal the light emitting devices 56 and the bonding wires 57 in resin.

Another conventional art device includes a light emitting semiconductor apparatus as shown in FIGS. 16 and 17. FIG. 16 is a front view, and FIG. 17 is a cross-sectional view taken along line A-A of FIG. 16. In this light emitting semiconductor apparatus, the light emitting devices B of FIG. 2 (light emitting device 59 of FIG. 15) are mounted instead of the light emitting devices C of FIG. 3, thus differentiating the device of FIGS. 16 and 17 from the above-described light emitting semiconductor apparatus of FIGS. 14 and 15.

In either one of the light emitting semiconductor apparatus of the conventional/related art, the light emitting devices 56, 59 are electrically connected in series. When a voltage is applied across a pair of the external connection terminals 55 that are led out of the lamp house 51 and located along the outer circumferential surface of the lamp house 51, all the light emitting devices 56, 59 are driven to emit light.

The light emitting device C has the direction characteristic shown in FIG. 6 and the light emitting device B has the direction characteristic shown in FIG. 5. The two types of light emitting semiconductor apparatus of the conventional/related art which contain such light emitting devices also have the direction characteristics shown in FIGS. 15 and 17, respectively.

The direction characteristics of the light emitting semiconductor apparatus of FIG. 15 which contains the plurality of light emitting devices C includes a region between adjacent light emitting devices C where light distributions thereof overlap widely, as shown. The presence of such a light distribution overlap region causes the following problem when incorporated into a light emitting semiconductor apparatus.

First, the overlap region receives a larger amount of light emitted from the light emitting device C than other regions such as a region in the vicinity of the optical axis of the light emitting device C. The overlap region also receives a larger amount of light that is wavelength-converted by the phosphor contained in the sealing resin and covering the light emitting device C, in comparison with other regions.

For example, if it is assumed that the light emitted from the light emitting device C is a blue light, and the apparatus uses a phosphor that can wavelength-convert the blue light into a complementary color yellow light when excited by the blue light to obtain a light chromatically near a white light, then when the light emitting semiconductor apparatus is observed from the direction of illumination, a bluish white light is released from an area where the light emitting device C is located. This is because the area has a stronger light source color received from the light emitting device C. A yellowish white light is released from an area between the light emitting devices C because the area has a stronger wavelength-converted light. As a result, the light emitting semiconductor apparatus exhibits color unevenness.

The phosphor and the light transmissive resin contained in the sealing resin, which are topically irradiated with the blue light having relatively higher energy among the various light rays, will deteriorate faster than the light transmissive resin and the phosphor in other regions.

Therefore, the deterioration of the light transmissive resin over time causes a reduction in the transmissivity of the resin and a variation in color. Similarly, the deterioration of the phosphor over time causes a reduction in the wavelength conversion efficiency of the phosphor. As a result, in the light emitting semiconductor apparatus, various problems arise over time associated with the topical deterioration and with respect to the amount and chromaticity of the illuminating light.

Specifically, a difference in topical deterioration rate between the phosphor and the light transmissive resin contained in the sealing resin results in remarkable variations in brightness and chromaticity in accordance with the cumulative drive time for the light emitting semiconductor apparatus.

On the other hand, the direction characteristic of the light emitting semiconductor apparatus of FIG. 17 which includes light emitting devices B also includes a region between adjacent light emitting devices B where light distributions thereof widely overlap, as shown.

Further, there is also a region that receives a smaller amount of light from the light emitting device B, as shown. This region becomes a factor that causes a variation in color of the light emitting semiconductor apparatus because only a small amount of light can be wavelength-converted by the phosphor at this location.

Therefore, various problems arise associated with the variation in color of the illuminating light as well as from the topical deterioration over time of the amount and chromaticity of the illuminating light, similar to the problems described above with respect to the device of FIG. 15.

SUMMARY

The disclosed subject matter has been made in consideration of the above and other problems, characteristics and features. A light emitting semiconductor apparatus is disclosed that can achieve reduced color unevenness associated with an illuminating light and can have a quality of suppressed topical deterioration over time of the amount and chromaticity of the illuminating light.

In accordance with an aspect of the disclosed subject matter, a light emitting semiconductor apparatus can include a plurality of light emitting semiconductor devices mounted on a substrate, wherein the light emitting semiconductor devices are sealed in a light transmissive resin containing a phosphor. The light emitting semiconductor devices can have at least two types of different direction characteristics, and the light emitting semiconductor devices having different direction characteristics are arrayed adjacent to each other.

In accordance with another aspect of a light emitting semiconductor apparatus of the disclosed subject matter, two types of direction characteristics can include one in the form of a substantial cone shape having a bottom adjacent to the light emitting semiconductor device, and another in the form of a substantial reverse cone having an apex adjacent to the light emitting semiconductor device.

In accordance with another aspect of a light emitting semiconductor apparatus of the disclosed subject matter, an odd number of light emitting semiconductor devices can be arranged in line. Alternatively the light emitting semiconductor devices can be arranged in a matrix with an odd number of rows and an odd number of columns, the rows and the columns each including an odd number of light emitting semiconductor devices. The light emitting semiconductor devices located at both ends in the case of an in-line arrangement have a direction characteristic in the form of a substantial cone. The light emitting semiconductor devices located at corners in the case of the matrix arrangement have a direction characteristic in the form of a substantial cone.

The plurality of light emitting semiconductor devices can have N-electrodes and P-electrodes connected alternately through die bonding or wire bonding, wherein the electrodes on adjacent light emitting semiconductor devices, if not connected through die bonding, are connected to each other through wire bonding.

Accordingly, it may be possible to reduce color unevenness associated with an illuminating light and suppress topical deterioration over time of the amount and chromaticity of the illuminating light.

DETAILED DESCRIPTION OF EXEMPLARY EMBODIMENTS

Figure 1:
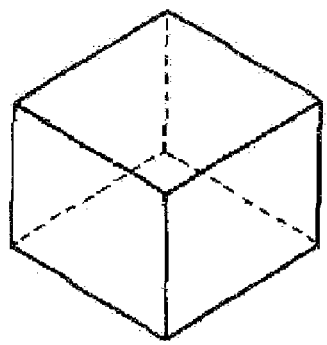
FIG. 1 is a perspective view of a light emitting semiconductor device.
Figure 2:
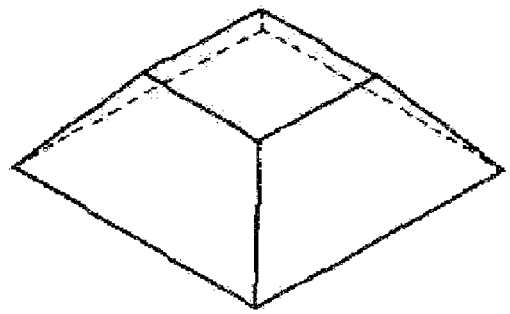
FIG. 2 is a perspective view of another light emitting semiconductor device.
Figure 3:
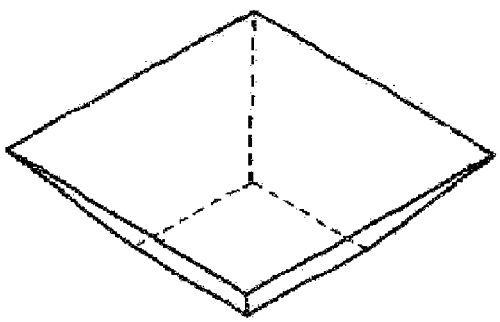
FIG. 3 is a perspective view of yet another light emitting semiconductor device.
Figure 4:
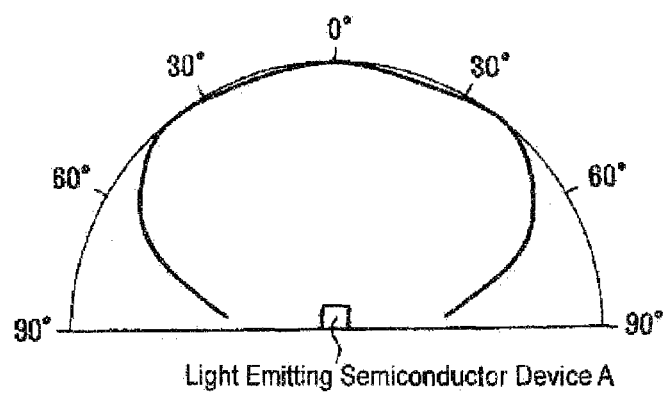
FIG. 4 shows a direction characteristic of the light emitting semiconductor device of FIG. 1.

Some exemplary embodiments of the disclosed subject matter will now be described in detail below with reference to FIGS. 1-13 (wherein the same or similar parts are denoted with the same reference numerals). The below-described embodiments are specific examples of the disclosed subject matter and are given various technical features. However, the disclosed subject matter is not limited to these embodiments.

EXAMPLE 1

Figure 7:
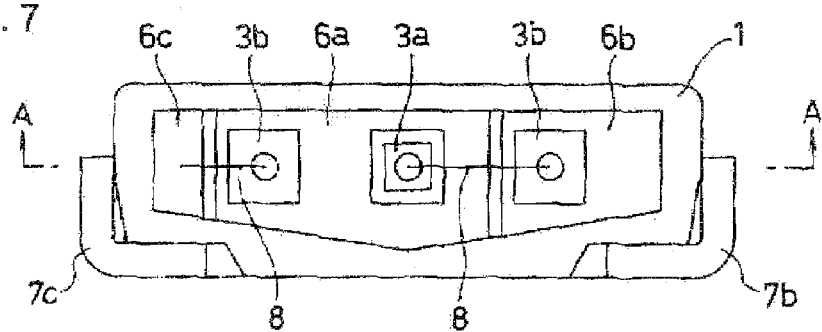
FIG. 7 is a front view of an exemplary embodiment of a light emitting semiconductor apparatus made in accordance with principles of the disclosed subject matter.
Figure 8:
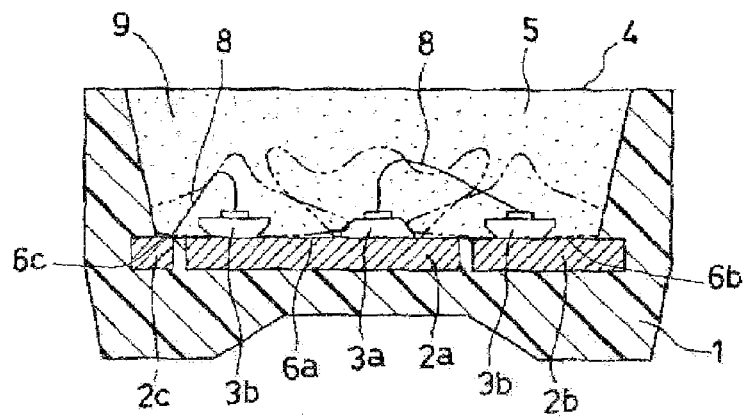
FIG. 8 is a cross-sectional view taken along line A-A of FIG. 7.
Figure 9:
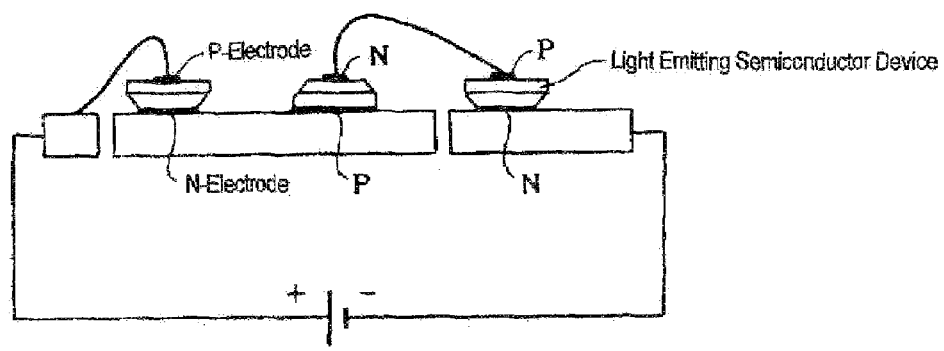
FIG. 9 is an illustrative view of light emitting semiconductor devices mounted for the apparatus of FIG. 7.
Figure 10:
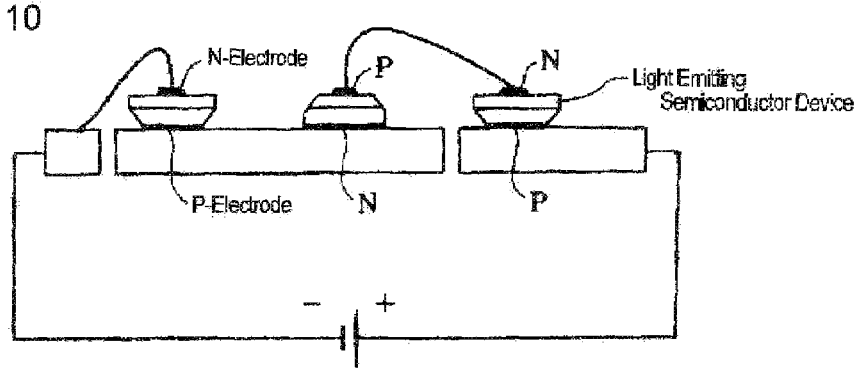
FIG. 10 is another illustrative view of light emitting semiconductor devices mounted for the apparatus of FIG. 7.
Figure 11:
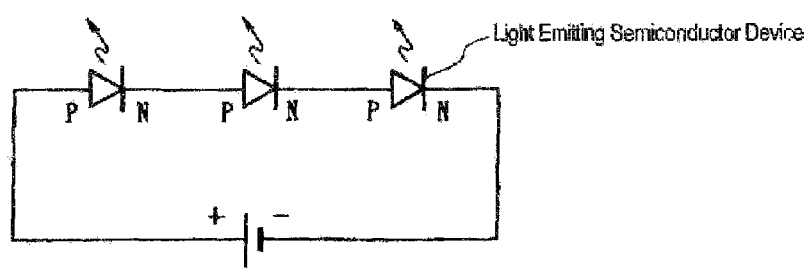
FIG. 11 is an internal wiring diagram for the apparatus of FIG. 7.

FIG. 7 is a front view of an example of a light emitting semiconductor device made in accordance with principles of the disclosed subject matter. FIG. 8 is a cross-sectional view taken along line A-A of FIG. 7. FIGS. 9 and 10 are illustrative views of mounted light emitting semiconductor devices for this example. FIG. 11 is an internal wiring diagram for the device shown in FIG. 7.

In FIGS. 7 and 8, a lamp house 1 composed of a resinous member and a substrate (lead frames 2a, 2b, 2c) composed of a metallic member are integrated through insert molding.

The lamp house 1 has a recess 5 with an aperture 4. The recess 5 has an inner bottom, through which bonding pads 6a, 6b, 6c are exposed in line on respective ends of three separate lead frames 2a, 2b, 2c. The bonding pads 2b, 2c form a pair located in an outermost position and extend through the lamp house 1 and lead out of the outer circumferential surface of the lamp house 1 to an external area to form a pair of external connection terminals 7b, 7c on the other end of the lead frames 2b, 2c. The terminals 7b, 7c are located along the outer circumferential surface of the lamp house 1.

Figure 5:
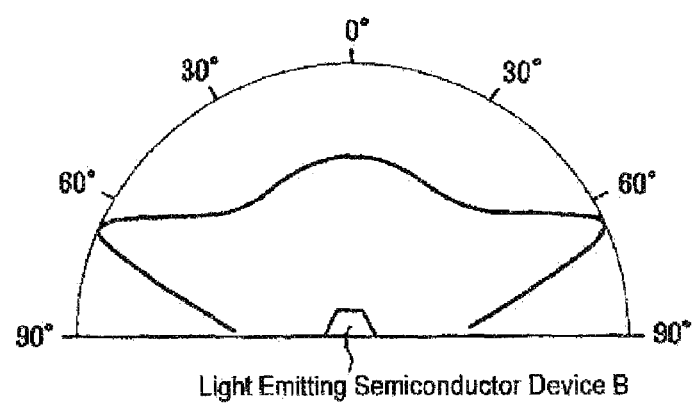
FIG. 5 shows a direction characteristic of the light emitting semiconductor device of FIG. 2.
Figure 6:
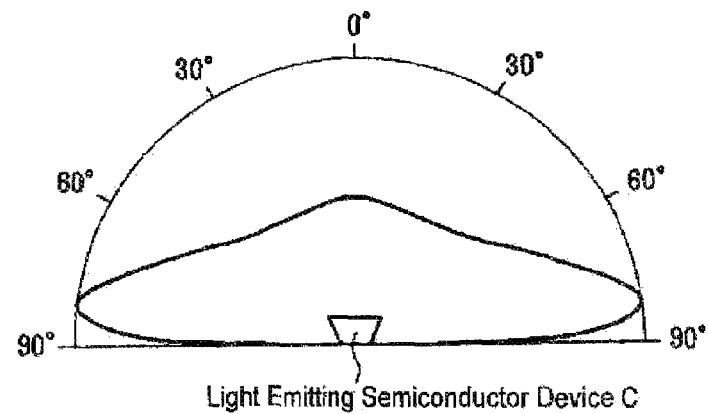
FIG. 6 shows a direction characteristic of the light emitting semiconductor device of FIG. 3.

In the present example, three light emitting devices 3a, 3b and 3b are used. The light emitting devices 3a and 3b are the same in material and structure (equal in light emission spectral distribution) but different in direction characteristic. Depending on the external form, the light emitting device may have either the direction characteristic of a substantial reverse conical form, as shown in FIG. 5, or the direction characteristic of a substantial conical form, as shown in FIG. 6.

Of the three bonding pads 6a, 6b, 6c exposed through the inner bottom of the lamp house 1, the centrally located bonding pad 6a is die-bonded to two light emitting devices 3a, 3b. Of the three bonding pads 6a, 6b, 6c exposed through the inner bottom of the lamp house 1, one of the bonding pads 6b, 6c of the outermost pair, or the bonding pad 6b, is die-bonded to one light emitting device 3b. No light emitting device is mounted on the bonding pad 6c. These three light emitting devices 3a, 3b, and 3b are mounted in line.

The two light emitting devices 3a, 3b mounted on the centrally located bonding pad 6a include the light emitting device 3b mounted closer to the bonding pad 6c. A wire bonding electrode on that light emitting device 3b is wire-bonded via a bonding wire 8 to the bonding pad 6c to establish electrical conduction therebetween. The light emitting device 3a located on the pad 6a and the light emitting device 3b located on the pad 6b have respective wire bonding electrodes thereon, which can be stitch-bonded via a bonding wire 8 to each other to establish electrical conduction therebetween. The two light emitting devices 3a, 3b mounted on the centrally located bonding pad 6a have respective die bonding electrodes, which are die-bonded to the bonding pad 6a to establish electrical conduction therebetween.

Accordingly, the light emitting semiconductor apparatus of the present example has internal wiring, which can be formed in a serial circuit as shown in FIG. 11.

The light emitting devices 3a, 3b can have the same material and structure and almost the same size. Therefore, a P-electrode (anode electrode) and an N-electrode (cathode electrode) can be formed on both the die bonding side and the wire bonding side. In a word, in the light emitting devices having the same light emission spectral distribution, the die bonding side may be used as the N-electrode and the wire bonding side as the P-electrode. Alternatively, the die bonding side may be used as the P-electrode and the wire bonding side as the N-electrode.

In the present example, the light emitting device using the die bonding side as the N-electrode (and the wire bonding side as the P-electrode) and the light emitting device using the die bonding side as the P-electrode (and the wire bonding side as the N-electrode) are mounted alternately as shown in FIGS. 9 and 10. In addition, the light emitting device 3b having the direction characteristic of a substantial conical form is mounted at an outermost position, and the light emitting device 3b having the direction characteristic of a substantial conical form and the light emitting device 3a having the direction characteristic of a substantial reverse conical form are mounted alternately as shown in FIG. 8.

In this case, the light emitting device 3a having the direction characteristic of a substantial reverse conical form may use a light emitting device that has an output peak at 45°-75° as shown in FIG. 5. The light emitting device 3b having the direction characteristic of a substantial conical form may use a light emitting device that has an output peak at a higher angle (close to the horizontal direction) than that of the light emitting device having the direction characteristic of a substantial reverse conical form. Specifically, a light emitting device can be used that has an output peak at near 80°-90°.

Instead of the above-described light emitting device that has a direction characteristic having a substantial reverse conical form, a light emitting device that has an output peak at 0° (in the normal direction) or near 0°-30° may be used. In such a case, the light passing through the phosphor-mixed light transmissive resin in that area topically increases and easily causes a variation in chromaticity. Therefore, it is difficult to reduce the phosphor concentration. Thus, a light emitting device having an output peak in the normal direction is not always preferable. Accordingly, a light emitting device that has an output peak at a higher angle (closer to the horizontal direction) than 45° can be used to avoid the above problems. Furthermore, a light emitting device that has an output peak at near 60° is suitable.

The recess 5 can be filled with a sealing resin 9 that includes a light transmissive resin containing one or more types of phosphors to seal the light emitting devices 3a, 3b, 3b and the bonding wires 8 in resin. The light transmissive resin contained in the sealing resin 9 is functional to protect the light emitting devices 3a, 3b, 3b from external environments such as moisture, dusts and gases and to protect the bonding wires 8 from external forces such as vibrations and impacts. In addition, the light exit surfaces of the light emitting devices 3a, 3b, 3b form interfaces with the sealing resin 9. Therefore, the refractive index of the sealing resin 9 that forms interfaces with the light exit surfaces of the light emitting devices 3a, 3b, 3b can be configured to be closer to that of the semiconductor material that forms the light exit surfaces of the light emitting devices 3a, 3b, 3b. Thus, the light transmissive resin also serves to improve the efficiency of extraction of the light emitted from the light exit surfaces of the light emitting devices 3a, 3b, 3b and which is led into the sealing resin 9.

The function of the phosphor contained in the sealing resin 9 is described above and is therefore omitted from the following description.

In a light emitting semiconductor apparatus thus configured, a certain voltage is applied across a pair of the external connection terminals 7b, 7c located along the outer circumferential surface of the lamp house 1. In this case, three serially connected light emitting devices 3a, 3b, 3b initiate emission of light. The light emitted from the three light emitting devices 3a, 3b, 3b form the direction characteristics shown with phantom lines in FIG. 8.

When the phosphor dispersed within the light distribution area is excited by the light emitted from the three light emitting devices 3a, 3b, 3b, the wavelength-converted light from the phosphor is guided through the sealing resin 9 and released externally. At this time, as described above, if the light emitted from the light emitting devices 3a, 3b, 3b include a blue light, the apparatus may use a phosphor that can wavelength-convert the blue light into a complementary color yellow light when excited by the blue light. In this case, the yellow light that results from the wavelength-conversion of the blue light emitted from the light emitting devices 3a, 3a, 3b and the blue light emitted from the light emitting devices are subjected to additional color mixture to obtain a light chromatically near a white light.

Similarly, if the light emitted from the light emitting devices 3a, 3b, 3b is a blue light, the apparatus may use two types of phosphors in mixture that can wavelength-convert the blue light into a green and a red light when excited by the blue light. In this case, the resulting green and red lights and the blue light emitted from the light emitting devices 3a, 3a, 3b can be subjected to additional color mixture to obtain a light chromatically almost equal to a white light.

In addition, if the light emitted from the light emitting devices 3a, 3b, 3b is an ultraviolet light, the apparatus may use three types of phosphors in mixture that can wavelength-convert the ultraviolet light into a blue, a green and a red light. In this case, the blue, green and red lights can be subjected to additional color mixture to obtain a light chromatically almost equal to a white light.

Further, the light emitted from the light emitting devices 3a, 3b, 3b and the phosphors may be mixed appropriately to obtain various chromatic lights such as a light almost equal to a white light or a light other than a light chromatically near white light.

In the present example, the shape of the light emitting device can be changed to control the direction characteristic of the light emitting device. Alternatively, the shape and/or size of the electrode (in particular, the electrode on the wire bonding side) may be changed to control the direction characteristic. In addition, the shape of the light emitting device and the shape and/or size of the electrode may be changed at the same time to control the direction characteristic.

The following description is given to the effects and/or functional aspects of the above-described examples. First, when the three light emitting devices 3a, 3b, 3b are mounted in line, the light emitting device 3b that has the direction characteristic of a substantial conical form is mounted at an outermost location. At the same time, the light emitting device 3b that has a direction characteristic of a substantial conical form and the light emitting device 3a that has a direction characteristic of a substantial reverse conical form are mounted alternately. As a result, a light distribution can be obtained as shown in FIG. 8.

Figure 15:
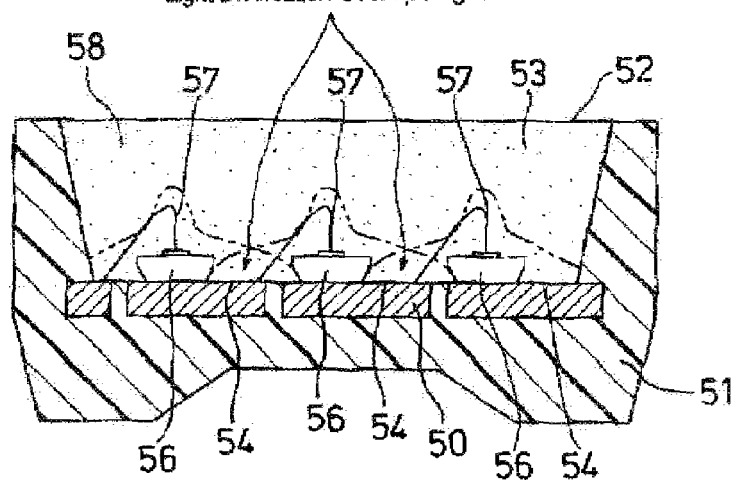
FIG. 15 is a cross-sectional view taken along line A-A of FIG. 14.
Figure 16:
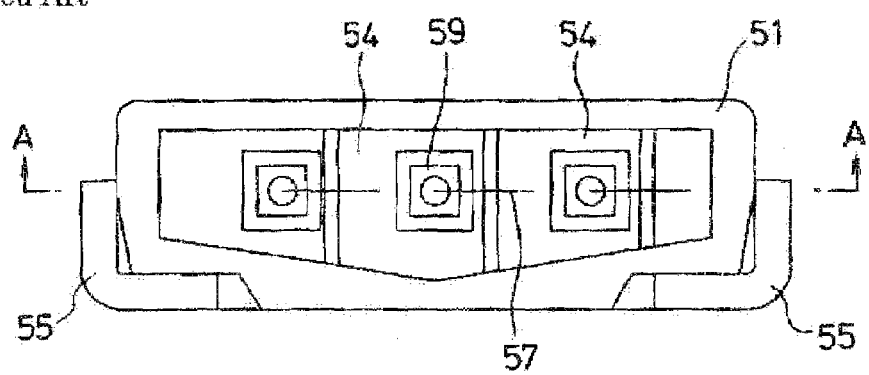
FIG. 16 is a front view of another conventional/related art semiconductor apparatus.
Figure 17:
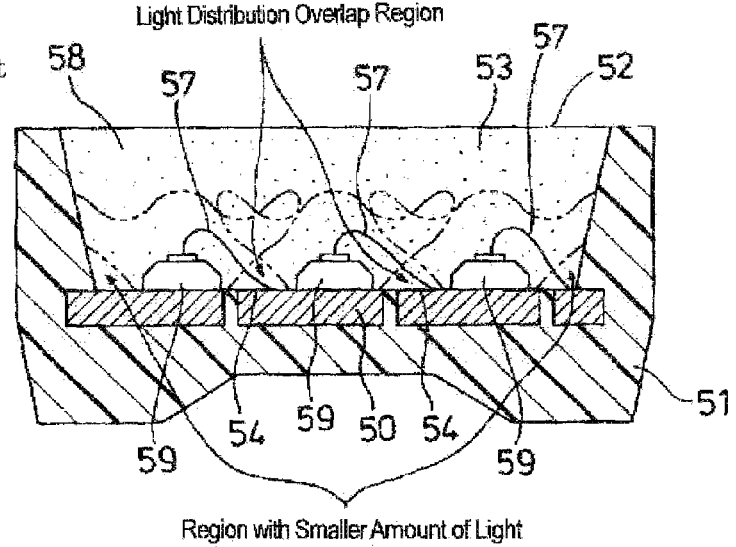
FIG. 17 is a cross-sectional view taken along line A-A of FIG. 16.

This light distribution has an comparatively smaller region where the light distributions of the adjacent light emitting devices 3a, 3b overlap, in comparison with that of the light emitting semiconductor apparatus of the conventional art shown in FIGS. 15 and 17. Thus, the light emitted from the light emitting devices 3a, 3b can be released almost uniformly within the sealing resin 9.

Therefore, the phosphor and the light transmissive resin contained in the sealing resin 9 of the light emitting semiconductor apparatus can have a uniform deterioration rate over the entire zone. In this case, less variation arises in brightness and chromaticity regardless of the cumulative elapsed drive time for the light emitting semiconductor apparatus.

The light emitting device 3b having a direction characteristic of a substantial conical form is mounted at an outermost location. Accordingly, a region that receives a smaller amount of light from the light emitting devices 3a, 3b (as in the light distribution of the light emitting semiconductor apparatus shown in FIG. 15) is hardly present in the above-described embodiment. Therefore, the phosphor dispersed within the sealing resin 9 can be exited almost uniformly over the entire zone. This is effective to realize a light emitting semiconductor apparatus with less variation in chromaticity.

On the other hand, in the case of the light emitting semiconductor apparatus of the conventional/related art shown in FIG. 17, the amount of light that is wavelength-converted by the phosphor dispersed within a region and that receives a smaller amount of light from the light emitting device can be used as a reference to determine the concentration of the phosphor mixed in the light transmissive resin. Accordingly, in order to ensure a certain amount of light that is wavelength-converted in the region, the concentration of the phosphor mixed in the light transmissive resin is determined to be higher.

In contrast, in the present example, the phosphor dispersed within the sealing resin 9 can be excited over the entire zone. Therefore, even if the concentration of the phosphor mixed in the light transmissive resin is determined to be lower than that in the light emitting semiconductor apparatus of the conventional/related art, it is possible to achieve an illuminating light of chromaticity corresponding to that of the light emitting semiconductor apparatus of the conventional/related art. Accordingly, usage of the phosphor can be reduced and the material expense can correspondingly be saved.

A test calculation expects to achieve about a 20-30% reduction in phosphor relative to the light emitting semiconductor apparatus of the conventional/related art.

Further, the phosphor has the function of wavelength converting the exciting light and the nature of absorbing and scattering part of the light, as described above. Accordingly, most of the light absorbed and scattered is converted into heat and not externally released. Therefore, a higher concentration of phosphor results in a lower brightness of the light emitting semiconductor apparatus.

In contrast, the above-described example makes it possible to reduce the concentration of phosphor, which can provide the light emitting semiconductor apparatus with higher brightness. The higher brightness results in a reduction in energy requirements.

The light emitting semiconductor apparatus containing a plurality of light emitting devices 3a, 3b, 3b serially connected through inner wiring can be realized as follows. Namely, the light emitting device having an N-electrode on the die bonding side (and the P-electrode on the wire bonding side) and the light emitting device having a P-electrode on the die bonding side (and the N-electrode on the wire bonding side) are alternately mounted. The light emitting device having an N-electrode on the die bonding side (and a P-electrode on the wire bonding side) and the light emitting device having a P-electrode on the die bonding side (and an N-electrode on the wire bonding side) are die-bonded to the common bonding pad 6a. The light emitting devices 3a, 3b mounted respectively on the adjacent bonding pads 6a, 6b are stitch-bonded to each other via a bonding wire 8 to establish electrical connection between the bonding pads 6a, 6b.

As a result, the number of the bonding pads for receiving the light emitting devices mounted thereon can be reduced to simplify the structure of the lead frame. The lead frame is generally molded through a process of pressing with a mold. Therefore, the structure of the mold can be simplified and the mold expense can be reduced.

There is no need for providing a wire bonding pad in between adjacent light emitting devices when the devices are mounted in line because no wire bonding is applied thereto. Therefore, it is possible to shorten the arrangement interval between the light emitting devices and downsize the light emitting semiconductor apparatus.

EXAMPLE 2

Figure 12:
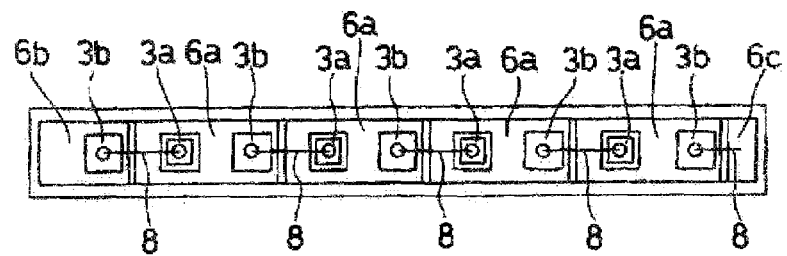
FIG. 12 is a plan view of another exemplary embodiment of a light emitting semiconductor apparatus made in accordance with principles of the disclosed subject matter.

FIG. 12 is a plan view of another exemplary embodiment of a light emitting semiconductor apparatus made in accordance with principles of the disclosed subject matter. The present example includes an increased number of light emitting semiconductor devices to be mounted, which is different from the above-described example 1.

In this example, there are a plurality (four in FIG. 12) of bonding pads 6a aligned and bonding pads 6b and 6c arranged on both ends. Each of the bonding pads 6a receives the light emitting semiconductor devices 3a and 3b mounted thereon. The bonding pad 6b can be configured to receive only the light emitting semiconductor device 3a mounted thereon. The bonding pad 6c of this example receives no light emitting semiconductor device mounted thereon. In this arrangement of the light emitting semiconductor devices, the light emitting devices 3b having the direction characteristic of the almost conical form are mounted on both outermost sides. At the same time, the light emitting devices 3b having a direction characteristic of a substantial conical form and the light emitting device 3a having a direction characteristic of a substantial reverse conical form can be alternately mounted.

In the present example, a plurality (odd number) of light emitting devices 3a, 3b are mounted and internally wired in series to realize a light emitting semiconductor apparatus. In this case, the light emitting device having the N-electrode on the die bonding side (and the P-electrode on the wire bonding side) and the light emitting device having the P-electrode on the die bonding side (and the N-electrode on the wire bonding side) are alternately mounted. In addition, the light emitting device having an N-electrode on the die bonding side (and a P-electrode on the wire bonding side) and the light emitting device having a P-electrode on the die bonding side (and an N-electrode on the wire bonding side) are die-bonded to the common bonding pad 6a. A plurality of such bonding pads 6a can be arranged in line. The light emitting devices 3a, 3b mounted respectively on the adjacent bonding pads 6a are stitch-bonded to each other via a bonding wire 8 to establish electrical connection between the adjacent bonding pads 6a. There are bonding pads 6b and 6c on both ends. The light emitting device 3a located closer to the bonding pad 6b on the bonding pad 6a adjacent to the bonding pad 6b is connected via a bonding wire 8 to the light emitting device 3b on the bonding pad 6b. The light emitting device 3b located closer to the bonding pad 6c on a bonding pad 6a located adjacent to the bonding pad 6c is connected via a bonding wire 8 to the bonding pad 6c.

The present example has the same basic arrangement as that of the example shown in FIG. 7 and accordingly exerts the similar effect and functions. In particular, the light emitting semiconductor apparatus of the above-described exemplary embodiment exhibits enhanced effects as compared to the light emitting semiconductor apparatus of the conventional/related art as the number of the mounted light emitting devices increases.

For example, the number of bonding wires for aerial wiring is subjected to a comparison. If the number of the mounted light emitting devices is an odd number, the number of bonding wires needed for a light emitting semiconductor apparatus of the conventional/related art is given as:

$$W = n - 1$$

and the number of bonding wires needed for a light emitting semiconductor apparatus of the disclosed subject matter is given as:

$$W = (n+1)/2$$

Where W is the number of bonding wires and n is the number of semiconductor light emitting devices. Therefore, as compared to the light emitting semiconductor apparatus of the conventional/related art, (n−3)/2 bonding wires, can be saved.

In this connection, if the number of the mounted light emitting devices is equal to five, one bonding wire can be saved, and when the number of the mounted light emitting devices is equal to nine, three bonding wires can be saved.

As a result, a reduction in material expense due to the saved bonding wires can lower the production cost.

EXAMPLE 3

Figure 13:
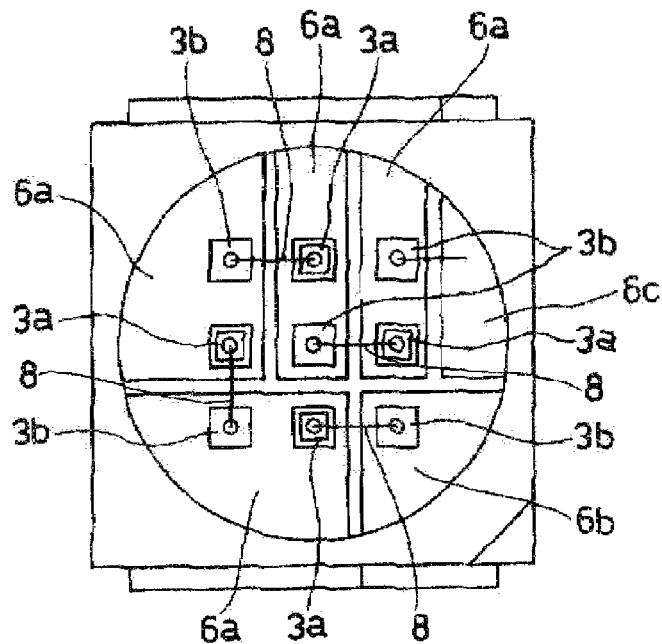
FIG. 13 is a plan view of another exemplary embodiment of a light emitting semiconductor apparatus made in accordance with principles of the disclosed subject matter.
Figure 14:
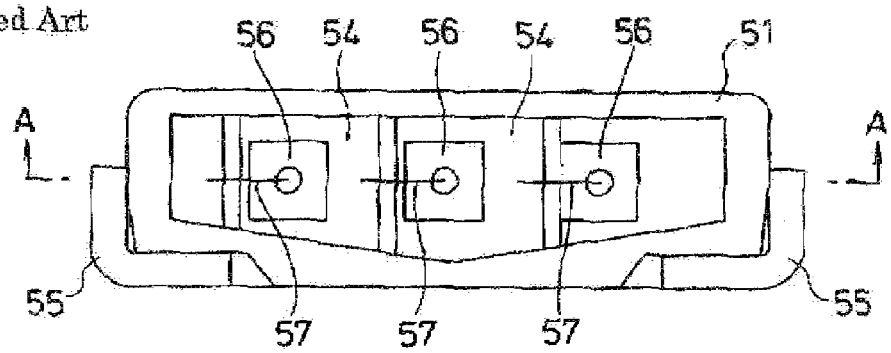
FIG. 14 is a front view of a conventional/related art semiconductor apparatus.

FIG. 13 is a plan view of another exemplary embodiment associated with the light emitting semiconductor apparatus of the disclosed subject matter. The present example includes a plurality of light emitting semiconductor devices 3a, 3b mounted in matrix. Also in this case, similar to the above examples of FIGS. 7 and 12, the light emitting devices 3a, 3b are internally wired in series in the light emitting semiconductor apparatus. In this case, the light emitting device having an N-electrode on the die bonding side (and a P-electrode on the wire bonding side) and the light emitting device having a P-electrode on the die bonding side (and an N-electrode on the wire bonding side) are alternately mounted in turn based on wiring. In addition, the light emitting device having an N-electrode on the die bonding side (and a P-electrode on the wire bonding side) and the light emitting devices 3a, 3b having a P-electrode on the die bonding side (and an N-electrode on the wire bonding side) are die-bonded to the common bonding pad 6a. A plurality of such bonding pads 6a are arranged in a plane. The light emitting devices 3a, 3b mounted respectively on adjacent bonding pads 6a are stitch-bonded to each other via a bonding wire 8 to establish electrical connection between the bonding pads 6a. In this embodiment, the bonding pad 6b includes only the light emitting semiconductor device 3b mounted thereon. The bonding pad 6c includes no light emitting semiconductor device mounted thereon. The electrical connections associated with the bonding pads 6b, 6c and the light emitting devices 3a, 3b can be the same as those in the examples described with respect to FIGS. 7 and 12.

A light emitting semiconductor device 3b having a direction characteristic of a substantial conical form can be mounted at each corner of the matrix. At the same time, the light emitting device 3b having a direction characteristic of a substantial conical form and the light emitting device 3a having a direction characteristic of a substantial reverse conical form are alternately mounted . The light emitting semiconductor devices having different direction characteristics can be arrayed adjacent to each other. In the case of this matrix arrangement, though, the light emitting semiconductor devices located diagonally adjacent to each other (in a slanting direction) do not match the definition of "adjacent to each other" in the presently disclosed subject matter.

The present example includes the light emitting devices 3a, 3b mounted in plane and the effects achieved thereby can reflect those of the previously described embodiments of the disclosed subject matter.

In a word, most of the aerial wiring using bonding wires is achieved by stitch bonding. Accordingly, the number of bonding pads that receive the light emitting devices mounted thereon can be reduced. In addition, the number of pads for wire bonding can be reduced to one or two. Further, the arrangement area for the light emitting device requires no lead for wiring that extends from the bonding pad. As a result, it is possible to narrow the interval between the light emitting devices mounted in matrix and realize a downsized light emitting semiconductor apparatus with a reduced mounting area for the light emitting device.

The light emitting semiconductor apparatus of the disclosed subject matter is usable as light sources in various fields such as LCD back-lights, reading light sources for printers, panel illuminators, general illuminators, light sources for vehicular lamps, various indicators, etc.

While there has been described what are at present considered to be exemplary embodiments of the invention, it will be understood that various modifications may be made thereto, and it is intended that the appended claims cover such modifications as fall within the true spirit and scope of the invention.

What is claimed is:

1. A light emitting semiconductor apparatus comprising:
a substrate;
a plurality of light emitting semiconductor devices mounted on the substrate, wherein the light emitting semiconductor devices are sealed in a light transmissive resin containing a wavelength conversion material, and at least one of the light emitting semiconductor devices has a first direction characteristic, and at least another of the light emitting semiconductors has a second direction characteristic that is different from the first direction characteristic, wherein the at least one of the light emitting semiconductor devices having the first direction characteristic is arrayed adjacent to the at least another of the light emitting semiconductor devices having the second direction characteristic.

2. The light emitting semiconductor apparatus according to claim 1, wherein the first direction characteristic is in the form of a substantial cone having a bottom and an apex, the bottom located closer to the at least one of the light emitting semiconductor devices than the apex, and the second direction characteristic is in the form of a substantial reverse cone having a reverse cone bottom and a reverse cone apex, the reverse cone apex located closer to the at least another of the light emitting semiconductor devices than the reverse cone bottom.

3. The light emitting semiconductor apparatus according to claim 2, wherein an odd number of the light emitting semiconductor devices are arranged in line, wherein a light emitting semiconductor device located at each end of the line has the first direction characteristic.

4. The light emitting semiconductor apparatus according to claim 2, wherein the light emitting semiconductor devices are arranged in a matrix with an odd number of rows and an odd number of columns, the rows and the columns each including an odd number of light emitting semiconductor devices, wherein a light emitting semiconductor device located at each corner of the matrix has the first direction characteristic.

5. The light emitting semiconductor apparatus according to claim 1, wherein the plurality of light emitting semiconductor devices have N-electrodes and P-electrodes connected alternately through at least one of die bonding and wire bonding, wherein the electrodes on adjacent light emitting semiconductor devices, if not connected through die bonding, are connected to each other through wire bonding.

6. The light emitting semiconductor apparatus according to claim 2, wherein the plurality of light emitting semiconductor devices have N-electrodes and P-electrodes connected alternately through at least one of die bonding and wire bonding, wherein the electrodes on adjacent light emitting semiconductor devices, if not connected through die bonding, are connected to each other through wire bonding.

7. The light emitting semiconductor apparatus according to claim 3, wherein the plurality of light emitting semiconductor devices have N-electrodes and P-electrodes connected alternately through at least one of die bonding and wire bonding, wherein the electrodes on adjacent light emitting semiconductor devices, if not connected through die bonding, are connected to each other through wire bonding.

8. The light emitting semiconductor apparatus according to claim 4, wherein the plurality of light emitting semiconductor devices have N-electrodes and P-electrodes connected alternately through at least one of die bonding and wire bonding, wherein the electrodes on adjacent light emitting semiconductor devices, if not connected through die bonding, are connected to each other through wire bonding.

9. The light emitting semiconductor apparatus according to claim 1, wherein the at least one of the plurality of the light emitting semiconductor devices is shaped to have a narrow base and a relatively wider top as compared to the narrow base, wherein the narrow base is located closer to the substrate than is the wider top.

10. The light emitting semiconductor apparatus according to claim 9, wherein the at least another of the plurality of the light emitting semiconductor devices is shaped to have a wide base and a relatively narrower top as compared to the wide base, wherein the wide base is located closer to the substrate than is the narrower top.

11. The light emitting semiconductor apparatus according to claim 10, wherein the at least one of the plurality of the light emitting semiconductor devices and the at least another of the plurality of the light emitting semiconductor devices are located in alternating fashion with respect to each other along one of a line formation and a matrix formation.

12. The light emitting semiconductor apparatus according to claim 1, wherein the wavelength conversion material is a phosphor.

13. A light emitting semiconductor apparatus comprising:
a substrate;
at least a first type of light emitting semiconductor device shaped to have a narrow base and a relatively wider top as compared to the narrow base, wherein the narrow base is located closer to the substrate than is the wider top;
at least a second type of light emitting semiconductor device shaped to have a wide base and a relatively narrower top as compared to the wide base, wherein the wide base is located closer to the substrate than is the narrower top; and
a light transmissive resin containing a wavelength conversion material located adjacent the first type of light emitting semiconductor device and the second type of light emitting semiconductor device.

14. The light emitting semiconductor apparatus according to claim 13, wherein the first type of light emitting semiconductor device is configured to emit light having a first direction characteristic that is in the form of a substantial cone having a bottom and an apex, the bottom located closer to the first type of light emitting semiconductor device than the apex, and the second type of light emitting semiconductor device is configured to emit light having a second direction characteristic that is in the form of a substantial reverse cone having a reverse bottom and a reverse apex, the reverse apex located closer to the second type of light emitting semiconductor device than the reverse bottom.

15. The light emitting semiconductor apparatus according to claim 13, wherein the first and second types of light emitting semiconductor devices are arranged in line, and a first type of light emitting semiconductor device is located at each end of the line.

16. The light emitting semiconductor apparatus according to claim 13, wherein the first and second types of light emitting semiconductor devices are arranged in a matrix with an odd number of rows and an odd number of columns, the rows and the columns each including an odd number of light emitting semiconductor devices, wherein a first type of light emitting semiconductor device is located at each corner of the matrix.

17. The light emitting semiconductor apparatus according to claim 13, wherein the first and second types of light emitting semiconductor devices have N-electrodes and P-electrodes connected alternately through at least one of die bonding and wire bonding, and electrodes on adjacent light emitting semiconductor devices, if not connected through die bonding, are connected to each other through wire bonding.

18. A light emitting semiconductor apparatus comprising:
a housing;
a lead frame located in the housing;
first means for emitting first light such that the first light is emitted in a first direction characteristic, the first means being located adjacent the lead frame;
second means for emitting second light such that the second light is emitted in a second direction characteristic that is different from and complementary to the first direction characteristic, the second means being located adjacent the first means; and
a light transmissive resin containing a wavelength conversion material located adjacent the first means and the second means.

19. The light emitting semiconductor apparatus according to claim 18, wherein the first direction characteristic of the first light is a substantial cone shape of light having a bottom and an apex, the bottom located closer to the lead frame than the apex, and the second direction characteristic of the second light is a substantial reverse cone shape of light having a reverse bottom and a reverse apex, the reverse apex located closer to the lead frame than the reverse bottom.

20. The light emitting semiconductor apparatus according to claim 18, wherein the first means and second means are light emitting semiconductor devices.

* * * * *